US012732192B2

(12) United States Patent
Bu et al.

(10) Patent No.: US 12,732,192 B2
(45) Date of Patent: Sep. 8, 2026

(54) POWER MANAGEMENT CHIP WITH MULTIPLEXED PIN AND POWER MANAGEMENT CHIP SYSTEM INCLUDING THE SAME

(71) Applicant: Chengdu Monolithic Power Systems Co., Ltd., Chengdu (CN)

(72) Inventors: Ning Bu, Chengdu (CN); Hao Wang, Hangzhou (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 19/045,259

(22) Filed: Feb. 4, 2025

(65) Prior Publication Data

US 2025/0253851 A1 Aug. 7, 2025

(30) Foreign Application Priority Data

Feb. 5, 2024 (CN) ........................ 202410162828.0

(51) Int. Cl.
*H03K 19/173* (2006.01)
*G06F 1/26* (2006.01)

(52) U.S. Cl.
CPC .......... *H03K 19/1737* (2013.01); *G06F 1/26* (2013.01)

(58) Field of Classification Search
CPC ......... H03K 19/1737; G06F 1/26; H02M 1/00
See application file for complete search history.

(56) References Cited

U.S. PATENT DOCUMENTS 8,341,582 B2 12/2012 Huynh
2019/0121647 A1* 4/2019 Por ....................... G06F 9/4411
2022/0206984 A1* 6/2022 Chang ................ G06F 13/4068

FOREIGN PATENT DOCUMENTS

CN 110275468 A 9/2019
CN 112260680 A * 1/2021 ......... H03K 19/0175
CN 114024429 A * 2/2022 .............. H02M 1/00

* cited by examiner

*Primary Examiner* — Seokjin Kim
(74) *Attorney, Agent, or Firm* — Ashurst Perkins Coie US LLP

(57) ABSTRACT

A power management chip comprises a multiplexed pin for receiving a communication indication signal, transmitting an analog signal and transmitting a digital signal; The communication circuit is configured to execute digital communication through the multiplexed pin; And a logic control core unit coupled to the multiplexed pin for receiving the communication indication signal from the multiplexed pin and configuring the multiplexed pin to transmit the digital signal based on the communication indication signal. In this way, only one pin is needed to receive the communication indication signal, transmit the analog signal and transmit the digital signal at the same time, thus saving the pin resources of the power management chip.

22 Claims, 5 Drawing Sheets

500

300

500

POWER MANAGEMENT CHIP WITH MULTIPLEXED PIN AND POWER MANAGEMENT CHIP SYSTEM INCLUDING THE SAME

CROSS-REFERENCE TO RELATED APPLICATIONS

The application claims priority to, and the benefit of, Chinese application No. 202410162828.0 filed on Feb. 5, 2024, which is incorporated herein by reference in its entirety.

TECHNICAL FIELD

The present disclosure relates to a power management chip, in particular but not limited to a power management chip with a multiplexed pin and a power management chip system including the power management chip.

BACKGROUND

With the popularization of digital control, power management chips are usually designed with digital communication function. For example, these power management chips can receive digital signals from external communication boxes to set electrical parameters and working conditions of the power management chips, such as switching frequency of power switches and output voltage of the power management chip, and so on. A communication module is arranged in such a power management chip for digital communication with an external communication box through one or more communication pins.

Due to the limited number of pins on the chip, it is necessary to provide a power management chip with a multiplexed pin, which can simultaneously multiplex digital signal transmission function and analog signal transmission function on one pin.

SUMMARY

An embodiment of the present disclosure provides a power management chip, which comprises a multiplexed pin is configured to receive a communication indication signal, transmitting analog signals and transmitting digital signals; The communication circuit is configured to execute digital communication through the multiplexed pin; And a logic control core unit coupled to the multiplexed pin for receiving the communication indication signal from the multiplexed pin and configuring the multiplexed pin for transmitting the digital signal based on the communication indication signal.

Another embodiment of the present disclosure provides a power management chip system, which comprises a pre-stage power management chip and a post-stage power management chip, wherein the post-stage power management chip is connected to the pre-stage power management chip through a multiplexed pin, and the post-stage power management chip comprises: The communication circuit is configured to execute digital communication through the multiplexed pin; And a logic control core unit coupled to the multiplexed pin for receiving the communication indication signal from the multiplexed pin and configuring the multiplexed pin to transmit digital signals based on the communication indication signal.

The power management chip and the power management chip system provided by the present disclosure can be configured to receive communication indication signals, transmitting analog signals and transmitting digital signals at the same time only by one pin.

BRIEF DESCRIPTION OF DRAWINGS

The present disclosure can be further understood with reference to the following detailed description and appended drawings, where like elements are provided with like reference numerals. These drawings are only for illustration purpose, thus may only show part of the devices and are not necessarily drawn to scale.

The same reference numerals in different schematic figures indicate the same or similar parts or features.

DETAILED DESCRIPTION

Various embodiments of the present disclosure will now be described. In the following description, some specific details, such as example circuits and example values for these circuit components, are included to provide a thorough understanding of embodiments. One skilled in the relevant art will recognize, however, that the present disclosure can be practiced without one or more specific details, or with other methods, components, materials, etc. In other instances, well-known structures, materials, processes or operations are not shown or described in detail to avoid obscuring aspects of the present disclosure.

Throughout the specification and claims, the phrases "in an embodiment", "in some embodiments", "in one implementation", and "in some implementations" as used includes both combinations and sub-combinations of various features described herein as well as variations and modifications thereof. These phrases used herein do not necessarily refer to the same embodiment, although it may. The term "or" is an inclusive "or" operator, and is equivalent to the term "and/or" herein, unless the context clearly dictates otherwise. The term "and/or" may include individual or any combination of the elements being referenced in conjunction with the term. Those skilled in the art should understand that the meanings of the terms identified above do not necessarily limit the terms, but merely provide illustrative examples for the terms. It is noted that when an element is "connected to" or "coupled to" the other element, it means that the element is directly connected to or coupled to the other element, or indirectly connected to or coupled to the other element via another element. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 1:
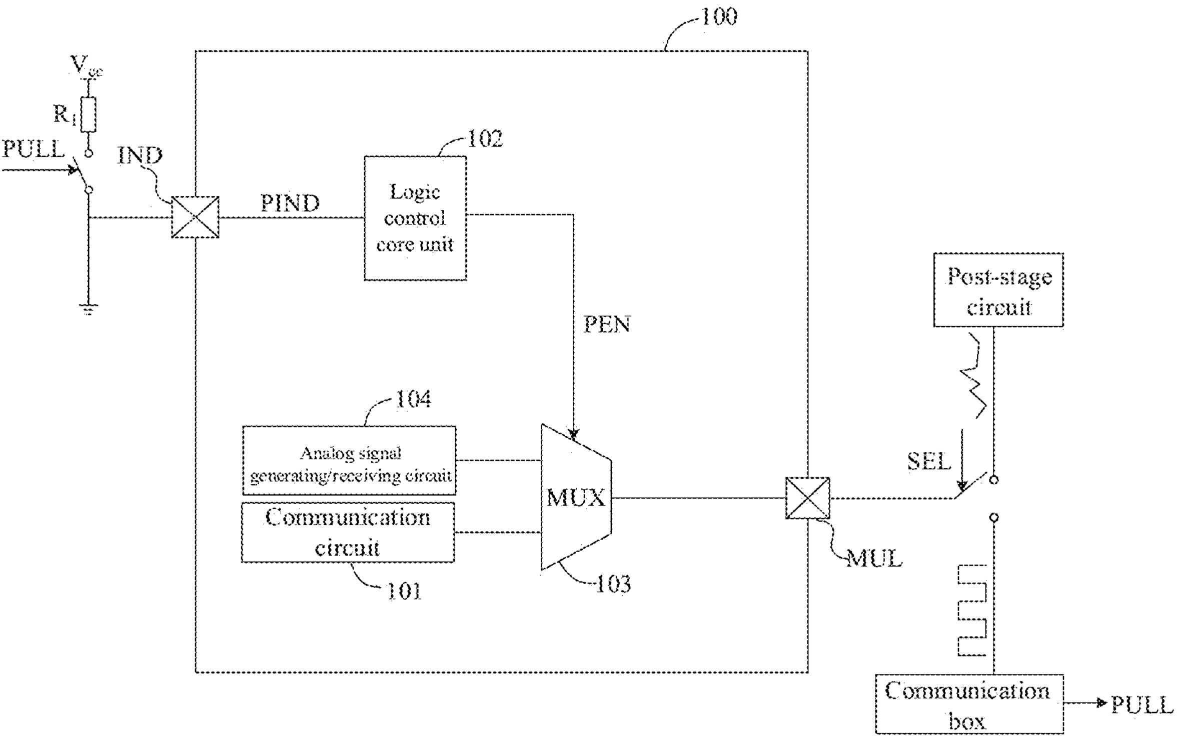
FIG. 1 shows a circuit diagram of a power management chip 100 with a multiplexed pin, according to an embodiment of the present disclosure.

FIG. 1 shows a circuit diagram of a power management chip 100 with a multiplexed pin in accordance with an embodiment of the present disclosure. In the example of FIG. 1, the power management chip 100 comprises a multiplexed pin to transmit both analog signals and digital signals. It should be understood that analog signals may be different based on the actual chip and the pin selected for multiplexing. Herein, when mentioning "transmit" signals or "transmission" of signals, it means either sending signals and/or receiving signals.

In an embodiment, as shown in FIG. 1, the power management chip 100 includes a communication circuit 101, a logic control core unit 102, a switching circuit 103, an analog signal generating/receiving circuit 104, a communication indication pin IND, and a multiplexed pin MUL.

In an embodiment, the multiplexed pin MUL is configured to transmit the analog signals and transmit the digital signals. When transmitting analog signals, the multiplexed pin MUL is coupled to an external circuit (e.g., shown as a post-stage circuit) for receiving analog signals from or sending analog signals to the external circuit through the multiplexed pin MUL. When transmitting digital signals, the multiplexed pin MUL is coupled to an external communication box (or called an upper computer) for receiving the digital signals from or sending the digital signals to the communication box. In an embodiment, as shown in FIG. 1, a selection signal SEL is configured to switch the multiplexed pin to be coupled to the communication box or the external circuit (or the post-stage circuit shown in FIG. 1). For example, the selection signal SEL is generated based on user's requirements on whether the user wants to transmit the analog signals or the digital signals under certain scenario.

In an embodiment, the analog signal generating/receiving circuit 104 is configured to receive the analog signals from the external circuit through the multiplexed pin MUL. In another embodiment, the analog signal generating/receiving circuit 104 is configured to generate the analog signals and send them to the external circuit through the multiplexed pin MUL. For example, in an implementation that the power management chip 100 is configured to control a power switch circuit, the analog signal generating/receiving circuit 104 is configured to generate a state indication signal based on an operating state of the power switch circuit. For example, the analog signal generating/receiving circuit 104 includes an under-voltage detection circuit or an over-power detection circuit. The state indication signal is generated when the power management chip 100 is detected under-voltage or over-power. In an implementation, the external circuit is a post-stage circuit of the power management chip 100, and the power management chip 100 transmit the state indication signal to the post-stage circuit and use it for enabling the post-stage circuit. It should be understood that the present disclosure is not limited to this, and the analog signal generating/receiving circuit 104 may also be other circuits that generate and send the analog signals to or receive the analog signals from external circuits through the multiplexed pin MUL.

In an embodiment, the logic control core unit 102 is configured to set a communication enable signal PEN to a set logic state (e.g., logic high) based on a communication indication signal PIND received from the communication indication pin IND, and provide the communication enable signal PEN to the switching circuit 103. For example, an external pull-up circuit (as shown in FIG. 1, the external pull-up circuit includes a resistor R1) is configured to pull up the voltage of the communication indication signal PIND to a preset voltage value to generate the communication indication signal PIND. In an implementation, when it is needed to communicate with the power management chip 100, the user can connect the communication indication pin IND to the pull-up circuit by a pull-up signal (for example, shown as signal PULL in FIG. 1) generated by the external communication box, so as to pull up the communication indication pin IND to the preset voltage value, thereby instructing the power management chip 100 to use the multiplexed pin MUL for digital communication (e.g., receiving the digital signals from the communication box or sending the digital signals to the communication box). In an implementation, the switching circuit 103 switches the multiplexed pin MUL to be connected to the communication circuit 101 based on the communication enable signal PEN being in a set logic state (e.g., logic high) to configure the multiplexed pin MUL for transmitting the digital signals, so that digital communication between the external communication box and the communication circuit 101 can be realized. Although it is shown in FIG. 1 that the logic control core unit 102 directly transmits the communication enable signal PEN to the switching circuit 103, the present disclosure is not limited to this. In another embodiment, the logic control core unit 102 transmits the communication enable signal PEN to the communication circuit 101, and then the communication circuit 101 transmits the communication enable signal PEN to the switching circuit 103.

In an embodiment, the switching circuit 103 configures the multiplexed pin MUL to transmit the digital signals or transmit the analog signals based on the communication enable signal PEN. For example, when the communication enable signal PEN is in a logic high state, the switching circuit 103 switches the multiplexed pin MUL to be connected to the communication circuit 101, thereby configuring the multiplexed pin MUL to transmit the digital signals, and when the communication enable signal PEN is in a logic low state, the switching circuit 103 switches the multiplexed pin MUL to be connected to the analog signals generating/receiving circuit 104, thereby configuring the multiplexed pin MUL to transmit the analog signals. In an embodiment, the switching circuit 103 includes a multiplexer MUX.

In an embodiment, the communication circuit 101 has a receiving terminal and a transmitting terminal (not shown) and transmits the digital signals through the multiplexed pin MUL. In an implementation, the receiving terminal of the communication circuit 101 receive external digital signals from the communication box through the multiplexed pin MUL, and the transmitting terminal of the communication circuit 101 send internal digital signals to the communication box through the multiplexed pin MUL. In an embodiment, the communication circuit 101 communicates with the communication box in an asynchronous communication mode. In another embodiment, the communication circuit 101 communicates with the communication box in a universal asynchronous transmission mode. In an implementation, the communication circuit 101 uses Universal Asynchronous Receiver/Transmitter (UART) protocol to communicate with the communication box. It should be understood that the communication circuit 101 can communicate with the communication box using any suitable communication protocol. The present disclosure is not limited to this.

In the example shown in FIG. 1, another separate pin (e.g., the communication instruction pin IND described above) is needed to receive the communication indication signal (e.g., the communication indication signal PIND described above) to control the multiplexed pin MUL for transmitting the digital signals.

In order to further reduce the number of pins, the present disclosure provides a power management chip, which can be configured to receive the communication enable signal, transmit the analog signals and transmit the digital signals through a single pin.

Figure 2:
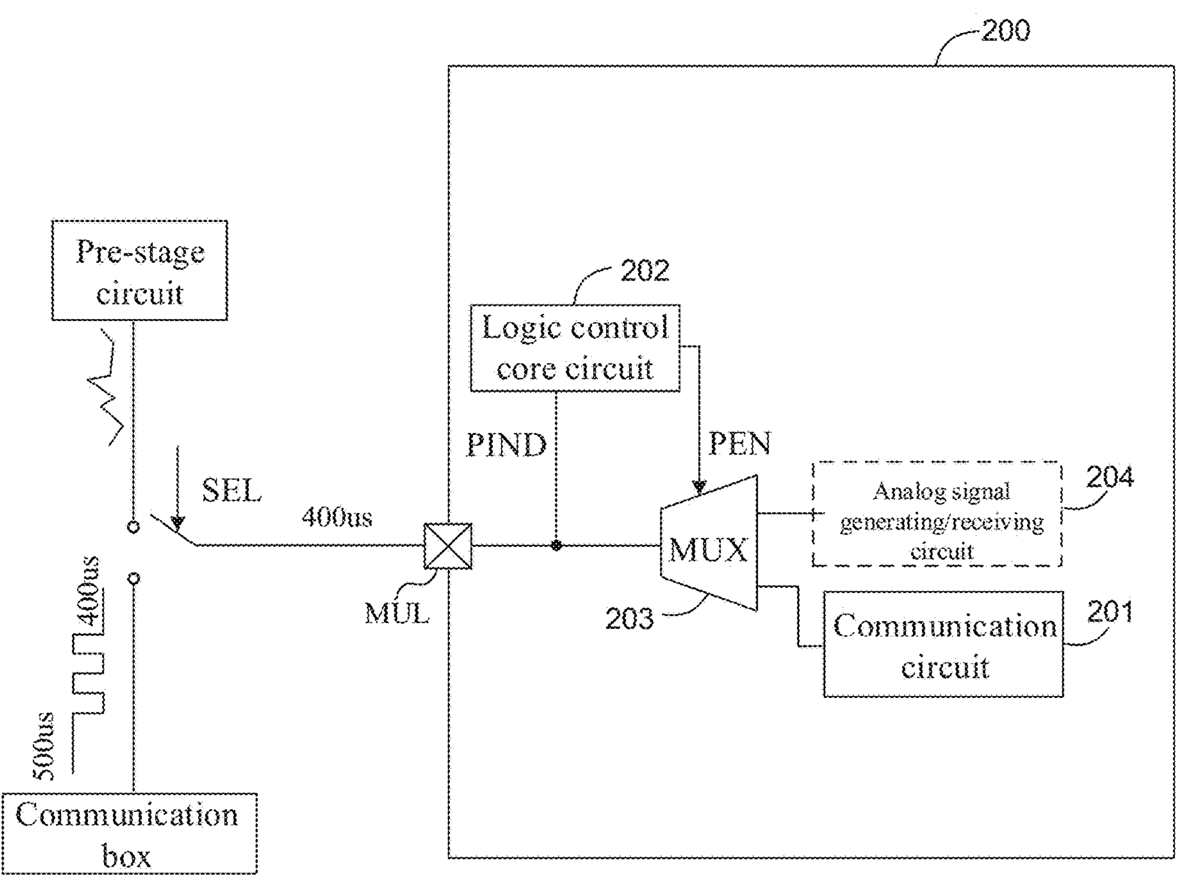
FIG. 2 shows a circuit diagram of a power management chip 200 with the multiplexed pin, according to an embodiment of the present disclosure.

FIG. 2 shows a circuit diagram of a power management chip with the multiplexed pin, according to an embodiment of the present disclosure. As shown in FIG. 2, the power management chip 200 includes a communication circuit 201, a logic control core unit 202, a switching circuit 203 and a multiplexed pin MUL.

In an embodiment, the multiplexed pin MUL is configured to transmit the digital signals and transmit analog signals and receive the communication indication signal. The communication indication signal is configured to instruct the power management chip 200 to transmit the digital signals through the multiplexed pin MUL.

In an embodiment, the multiplexed pin MUL is coupled to an external circuit (e.g., shown as a pre-stage circuit). For example, the external circuit is a pre-stage power management chip in a multi-stage power conversion system. In an embodiment, when it is needed to transmit an analog signal by the multiplexed pin MUL, the multiplexed pin MUL can be coupled to the external circuit under the controlling of the selection signal SEL. In an embodiment, the multiplexed pin MUL is configured to receive the analog signals from the external circuit (e.g., the pre-stage circuit). In an embodiment, the amplitude of the analog signals transmitted to the power management chip 200 from the external circuit is lower than a first set voltage threshold. For example, the pre-stage power management chip usually has an overvoltage protection function to avoid high voltage surge, so that the amplitude of the analog signal transmitted from the pre-stage power management chip to the power management chip 200 is lower than the first set voltage threshold. In an embodiment, the power management chip further includes an analog signal generating/receiving circuit (shown as a dashed box 204 in FIG. 2) for receiving the analog signals from the external circuit through the multiplexed pin MUL. In FIG. 2, coupling the multiplexed pin MUL to the pre-stage circuit and receiving the analog signals from the pre-stage circuit is only proposed as an illustrative example, and the present disclosure is not limited thereto. In another embodiment, the multiplexed pin MUL is coupled to a post-stage circuit and receive analog signals from the post-stage circuit. In an implementation, the amplitude of the analog signal received from the post-stage is also lower than a set voltage threshold.

In an embodiment, the multiplexed pin MUL is coupled to a communication box and receive a communication indication signal from the communication box. For example, when a digital signal needs to be transmitted through the multiplexed pin MUL, the multiplexed pin MUL is controlled to be coupled to the communication box under controlling of the selection signal SEL. In an embodiment, the communication indication signal has a first preset duration (e.g., 500 us as shown in FIG. 2) and has a voltage amplitude exceeding the first set voltage threshold. In an embodiment, the communication indication signal is a digital signal. For example, a plurality of high-level signals continuously sent by the communication box can be used as the communication indication signal. In another embodiment, the communication indication signal is an analog signal. In an implementation, the communication box transmits digital signals by, for example, the UART protocol, before transmitting the digital signals, the communication box sets a state of a digital signal transmission line to a high-level by default in advance to enter a standby state to prepare for transmitting the digital signals. In the present disclosure, when the communication box is ready to transmit digital signals, the default high-level signal on the digital signal transmission line is called a startup signal of the communication box. At this time, the signal on the multiplexed pin MUL is pulled up to the same high level as the digital signal transmission line. Therefore, by controlling a duration of the high-level on the digital signal transmission line and an amplitude of the high-level signal when the communication box is in the ready state, the start signal when the communication box is in the ready state can be transmitted to the multiplexed pin MUL as a communication indication signal. For example, the high-level start signal has a first preset duration (for example, it is shown as 500 us) and the amplitude of the start signal exceeds the first set voltage threshold.

In an embodiment, the logic control core unit 202 in the power management chip 200 is coupled to the multiplexed pin MUL, and the logic control core unit 202 is configured to set the communication enable signal PEN to a set logic state (e.g., logic high) based on the communication indication signal (shown as PIND) received through the multiplexed pin MUL, and send the communication enable signal PEN to the switching circuit 203 for configuring the multiplexed pin MUL to transmit the digital signals. In an embodiment, the logic control core unit 202 includes a programmable logic unit such as a Multiple-Time Programmable logic unit (MTP).

In an embodiment, the switching circuit 203 connect the multiplexed pin MUL to the communication circuit 201 based on the communication enable signal PEN being in the set logic state (e.g., logic high), thereby configuring the multiplexed pin MUL to transmit digital signals. As such, the digital communication can be realized between the communication circuit 201 and the external communication box. For example, during digital communication, the communication circuit 201 sends internal digital signals to the communication box through the multiplexed pin MUL, and receives external digital signals from the communication box through the multiplexed pin MUL.

In an embodiment, the power management chip 200 is further configured to send the analog signals to the external circuit (e.g., the pre-stage circuit) through the multiplexed pin MUL. In an embodiment, the analog signal generating/receiving circuit 204 is configured to generate the analog signals and transmit the generated analog signals to the external circuit (e.g., the pre-stage circuit) through the multiplexed pin MUL.

In an embodiment, as shown in FIG. 2, the switching circuit 203 includes a multiplexer MUX coupled between the multiplexed pin MUL and the communication circuit 201. The analog signal generating/receiving circuit 204 may be coupled to the multiplexed pin MUL through the multiplexer MUX for this example. By controlling the multiplexer MUX, the multiplexed pin MUL can be controlled to connect to either the communication circuit 201 or the analog signal generating/receiving circuit 204. For example, when the communication enable signal PEN is in the set logic state (e.g., logic high), the multiplexer MUX connects the multiplexed pin MUL to the communication circuit 201 and disconnects the multiplexed pin MUL from the analog signal generating/receiving circuit 204. When the communication enable signal PEN is in the reset logic state (e.g., logic low), the multiplexer MUX connects the multiplexed pin MUL to the analog signal generating/receiving circuit 204 and disconnects the multiplexed pin MUL from the communication circuit 201.

In an embodiment, when the digital signals transmission is completed, the logic control core unit 202 receives a communication stop signal from the communication box through the multiplexed pin MUL. In an embodiment, the communication stop signal is a digital signal. For example, the communication stop signal is a digital command recognizable by the logic control core unit 202. In an implementation, the digital command is consecutive logic low pulses (e.g., shown as a low-level signal up to 400 us in FIG. 2).

In an embodiment, the logic control core unit 202 in the power management chip 200 sets the communication enable signal PEN to the reset logic state (e.g., logic low) based on the communication stop signal. The switching circuit 203 disconnects the multiplexed pin MUL from the communication circuit 201 and connects the multiplexed pin MUL to the analog signal generating/receiving circuit 204 based on the communication enable signal PEN being in the reset logic state (e.g., logic low).

Figure 3:
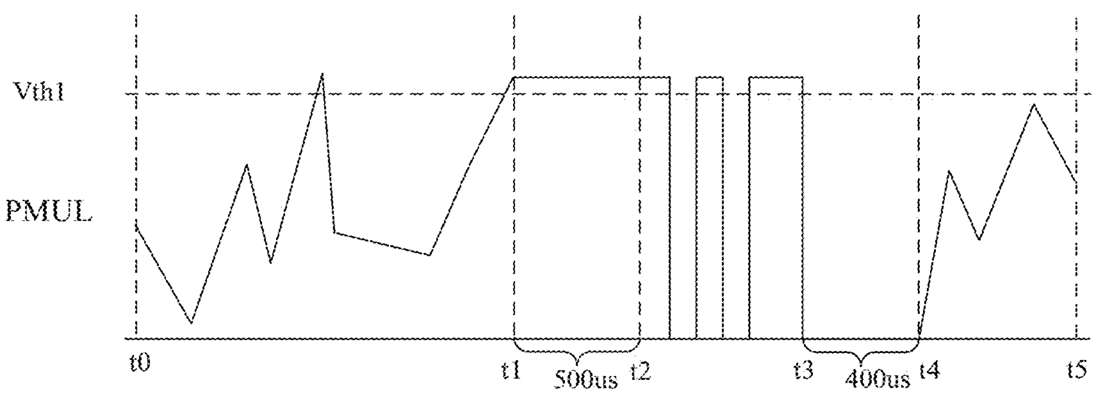
FIG. 3 shows waveforms of some signals on the multiplexed pin MUL when the multiplexed pin MUL is switched between an analog signal transmission function (e.g., receiving analog signals and/or sending analog signals) and a digital signal transmission function (e.g., receiving analog signals and/or sending digital signals).

FIG. 3 shows a waveform diagram of some signals on the multiplexed pin MUL of the power management chip 200 when the multiplexed pin MUL is switched between the analog signal transmission function (e.g., receiving analog signals and/or sending analog signals) and the digital signal transmission function (e.g., receiving digital signals and/or sending analog signals). In FIG. 3, Vth1 represents the voltage threshold of the analog signals input from the pre-stage circuit to the power management chip 200. For convenience of description, in FIG. 3, the signal on the multiplexed pin MUL is identified as a multiplexed pin signal PMUL.

As shown in FIG. 3, during the period from time t0 to time t1, the multiplexed pin MUL works in the analog signal transmission function for receiving the analog signals from the pre-stage circuit. At this time, the amplitude of the multiplexed pin signal PMUL is the same as that of the analog signal received from the pre-stage circuit. As shown in FIG. 3, during the period from time t0 to time t1, the magnitude of the multiplexed pin signal PMUL is lower than a first set voltage threshold (shown as Vth1).

During the period from time t1 to time t2, the power management chip 200 receives a signal higher than the first set voltage threshold Vth1 from the communication box through the multiplexed pin MUL and maintains it for a set time (e.g., 500 us as shown in FIG. 3). In an implementation, a signal between time t1 and time t2 is referred to as the communication indication signal. At this time, the amplitude of the multiplexed pin signal PMUL is the same as that of the communication indication signal.

After receiving the communication indication signal, from time t2, the power management chip 200 switches the multiplexed pin MUL to the digital signal transmission function based on the communication indication signal, for receiving an external digital signal from the communication box or sending an internal digital signal to the communication box. At this time, the amplitude of the multiplexed pin signal PMUL is the same as that of the digital signal. In an embodiment, the amplitude of the logic high-level of the digital signal is the same as that of the communication indication signal.

Until time t3, the digital communication is completed, and the multiplexed pin MUL receives a communication stop signal (e.g., a low-level signal shown as 400 us in FIG. 3) from the communication box. In an implementation, the communication stop signal lasts until time t4. From time t4, the multiplexed pin MUL resumes the function of analog signal transmission and continues to receive the analog signal from the pre-stage power management chip.

Compared with the power management chip 100 shown in FIG. 1, on the one hand, the power management chip 200 in FIG. 2 can save a pin dedicated to receiving the communication indication signal PIND (e.g., pin IND in FIG. 1). On the other hand, it can directly pull up the voltage on the multiplexed pin MUL to a voltage higher than the first set voltage threshold Vth1 based on the startup signal of the communication box and maintain this voltage for a preset duration, so as to instruct the power management chip 200 to switch the multiplexed pin MUL to transmit the digital signal. This method can switch the multiplexed pin MUL to perform digital signal transmission function without setting a dedicated pull-up circuit.

Figure 4:
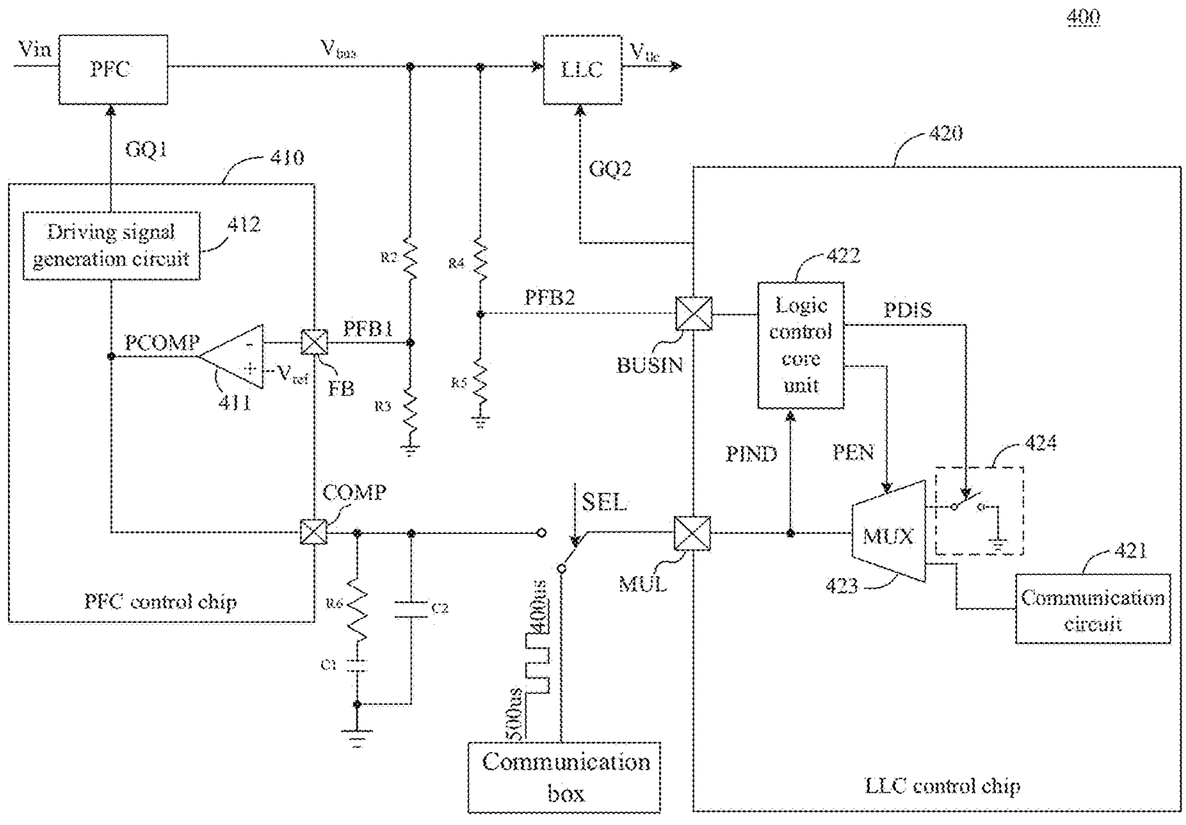
FIG. 4 shows a circuit diagram of a power management chip system 400 with the multiplexed pin, according to an embodiment of the present disclosure.

FIG. 4 shows a circuit diagram of a power management chip system 400 with the multiplexed pin, according to an embodiment of the present disclosure.

As shown in FIG. 4, in an embodiment, the power management chip 400 includes a pre-stage power management chip 410 and a post-stage power management chip 420. In an embodiment, the post-stage power management chip 420 is an embodiment of the power management chip 200 shown in FIG. 2. The present disclosure is not limited thereto. In another embodiment, the pre-stage power management chip 410 is an embodiment of the power management chip 200 shown in FIG. 2. In this embodiment, As shown in FIG. 4, the post-stage power management chip 420 includes a communication circuit 421, a logic control core unit 422, a switching circuit 423, and a multiplexed pin MUL. In an implementation, the communication circuit 421, the logic control core unit 422, the switching circuit 423 and the multiplexed pin MUL are respectively the embodiments of the communication circuit 201, the logic control core unit 202, the switching circuit 203 and the multiplexed pin MUL shown in FIG. 2. For the sake of brevity, the similar parts of the post-stage power management chip 420 and the power management chip 200 will not be described again.

In an embodiment, the power management chip system 400 is suitable for a two-stage power conversion system. For example, the two-stage power conversion system is an AC-DC two-stage power conversion system, which usually has a pre-stage power conversion circuit for converting an AC input voltage into an intermediate DC voltage and a post-stage power conversion circuit for converting the intermediate DC voltage provided by the pre-stage power conversion circuit into an output voltage suitable for a load. For example, the power management chip 410 may be a control chip for controlling a pre-stage power conversion circuit, and the power management chip 420 may be a control chip for controlling a post-stage power conversion circuit. For another example, the power management chip 410 can also be a power management chip that includes both the pre-stage power conversion circuit and its control circuit, and the power management chip 420 can also be a power management chip that includes both the post-stage power conversion circuit and its control circuit. In FIG. 4, the power management chip system 400 is described with the power management chip 410 being a Power Factor Correction (PFC) control chip and the power management chip 420 being an LLC control chip. In the example shown in FIG. 4, the power management chip 410 and the power management chip 420 are configured to control the PFC circuit and the LLC circuit respectively (as shown in FIG. 4, for example, by using the driving signals GQ1 and GQ2), wherein the PFC circuit is configured to convert the input voltage Vin into the intermediate DC voltage Vbus, and the LLC circuit is configured to convert the intermediate DC voltage Vbus into the output voltage Vllc suitable for the load. It should be understood that the power management chip 410 and the power management chip 420 can be power management chips in any other suitable type of two-stage power conversion circuit architecture, and the present disclosure is not limited to this.

In an embodiment, as shown in FIG. 4, the pre-stage power management chip 410 has a feedback terminal (e.g., shown as pin FB) for receiving a feedback signal PFB1 characterizing the output voltage (i.e., intermediate DC voltage Vbus) of the pre-stage power supply conversion circuit (shown as PFC circuit). In an implementation, as shown in FIG. 4, a feedback network composed of R2 and R3 is connected to the output end of a pre-stage power conversion circuit (e.g., shown as a PFC circuit in FIG. 4), and generates a feedback signal PFB1 based on the intermediate DC voltage Vbus output by the pre-stage power conversion circuit. In an implementation, the pre-stage power management chip 410 compares the feedback voltage PFB1 representing the intermediate DC voltage Vbus with the reference voltage Vref by using the error comparator 411 to generate the compensation signal PCOMP, and generates the driving signal GQ1 by using the driving signal generation circuit 412 based on the compensation signal PCOMP, thereby controlling the output voltage of the pre-stage power supply conversion circuit to be adjusted to the target voltage.

In an embodiment, the pre-stage power management chip 410 also has a compensation terminal (shown as pin COMP, for example) for outputting a compensation signal PCOMP. There will be a compensation network composed of resistors (e.g., resistor R6) and/or capacitors (for example, capacitors C1 and C2) coupled between pin COMP and the reference ground in general. In an embodiment, the voltage amplitude of the compensation signal PCOMP on the pin COMP and the amplitude of the feedback signal PFB1 on the pin FB are lower than a second set voltage threshold and a third set voltage threshold, respectively. For example, in order to prevent the power management chip from being damaged by high-voltage surge, the pre-stage power conversion circuit usually has an overvoltage protection function, so that the amplitude of the intermediate DC voltage Vbus output by the pre-stage power conversion circuit is lower than a voltage limitation, so the voltage of the feedback signal PFB1 representing the intermediate DC power supply Vbus will be lower than a set voltage threshold (e.g., called the second set voltage threshold). In addition, based on the principle of the driving signal generation circuit, the driving signal generation circuit 412 generates the driving signal GQ1 based on the compensation signal PCOMP, thereby controlling the output voltage of the pre-stage power conversion circuit to be adjusted to the target voltage value. The voltage of the compensation signal PCOMP should be lower than a set voltage threshold (e.g., called the third set voltage threshold) to meet the design requirements of the maximum on-time of the driving signal.

In an embodiment, the multiplexed pin MUL of the post-stage power management chip 420 is coupled to the compensation terminal of the pre-stage power management chip 410 (e.g., shown as pin COMP) for sensing the voltage on the compensation terminal of the pre-stage power management chip 410. For example, when an analog signal needs to be transmitted by using the multiplexed pin MUL, the multiplexed pin MUL is coupled to the compensation terminal of the pre-stage power management chip 410 by using the selection signal SEL. In an implementation, as mentioned above, the amplitude of the voltage at the compensation terminal is lower than the third set voltage threshold.

In an embodiment, the multiplexed pin MUL of the post-stage power management chip 420 is coupled to a communication box and receive a communication indication signal PIND from the communication box. For example, when a digital signal needs to be transmitted by using the multiplexed pin MUL, the multiplexed pin MUL is coupled to the communication box by using the selection signal SEL. In an embodiment, the communication indication signal PIND has a first preset duration (e.g., shown as 500 us in FIG. 4) and a voltage amplitude exceeding the third preset voltage threshold. In an embodiment, the communication indication signal PIND is a digital signal. For example, the communication box sends a plurality of continuous high-level signals with amplitudes higher than the third preset voltage threshold as communication indication signals PIND indicating communication. In another embodiment, the communication indication signal PIND is an analog signal. In an implementation, in the embodiment where a communication box transmits a digital signal by, for example, UART protocol, before transmitting the digital signal, the communication box sets the state of the digital signal transmission line to a high level by default in advance to enter a standby state to prepare for transmitting the digital signal. In the present disclosure, the default high-level signal on the digital signal transmission line is called the startup signal of the communication box. At this time, the signal on the multiplexed pin MUL is pulled up to the same high level as the data transmission line of the communication box. Therefore, by controlling the duration of the high-level and the amplitude of the high-level signal on the digital signal transmission line when the communication box is in the ready state, the startup signal when the communication box is in the ready state can be transmitted to the multiplexed pin MUL as the communication indication signal PIND.

In an embodiment, the logic control core unit 422 in the post-stage power management chip 420 sets the communication enable signal PEN to a preset logic state (e.g., logic high) based on the communication indication signal PIND received through the multiplexed pin MUL, and sends the communication enable signal PEN to the switching circuit 423. The switching circuit 423 switches the multiplexed pin MUL to be connected with the communication circuit 421 based on the preset logic state (e.g., logic high) of the communication enable signal PEN, so as to configure the multiplexed pin MUL for transmitting the digital signals, thereby realizing digital communication between the communication circuit 421 and an external communication box. In an embodiment, the logic control core unit 422 includes a programmable logic unit such as a Multiple-Time Programmable logic unit (MTP).

In an embodiment, when the digital signal transmission is completed, the logic control core unit 422 receives the communication stop signal from the communication box through the multiplexed pin MUL. In an embodiment, the communication stop signal is a digital signal. For example, the communication stop signal is a digital command recognizable by the logic control core unit 422. In an implementation, the digital command is a continuous number of logic low levels (e.g., shown as a low level of up to 400 us).

In an embodiment, the logic control core unit 422 in the post-stage power management chip 420 sets the communication enable signal PEN to a reset logic state (e.g., logic low) based on the communication stop signal. The switching circuit 423 disconnects the connection between the multiplexed pin MUL and the communication circuit 421, and connects the multiplexed pin MUL to the analog signal generating/receiving circuit 424 based on the communication enable signal PEN being in the reset logic state (e.g., logic low).

In an embodiment, the post-stage power management chip 420 further includes an analog signal generating/receiving circuit 424 (shown as a dashed box in FIG. 4) for generating an analog signal and transmitting the generated analog signal to the pre-stage power management chip 410 through the multiplexed pin MUL. In an embodiment, as shown in FIG. 4, the analog signal generating/receiving circuit 424 includes a switching element and a reference ground.

In an embodiment, as shown in FIG. 4, the switching circuit 423 includes a multiplexer MUX coupled between the multiplexed pin MUL and the communication circuit 421. The analog signal generating/receiving circuit 424 may be coupled to the multiplexed pin MUL through the multiplexer MUX for this example. By controlling the multiplexer MUX, the multiplexed pin MUL can be controlled to be connected to the communication circuit 421 or the analog signal generating/receiving circuit 424. For example, when the communication enable signal PEN is in a preset logic state (e.g., logic high), the multiplexer MUX connects the multiplexed pin MUL to the communication circuit 421, and disconnects the connection between the multiplexed pin MUL and the analog signal generating/receiving circuit 424. When the communication enable signal PEN is in the reset logic state (e.g., logic low), the multiplexer MUX connects the multiplexed pin MUL to the analog signal generating/receiving circuit 424 and disconnects the connection between the multiplexed pin MUL and the communication circuit 421.

In an implementation, the analog signal generating/receiving circuit 424 includes a switching element. When the multiplexed pin MUL is configured to transmit analog signals, the switching element is turned off, the multiplexed pin MUL is connected to the reference ground, and the voltage on the reference ground is sent to the compensation pin COMP of the pre-stage power management chip 410 through the multiplexed pin MUL. In one example, the post-stage power management chip 420 further includes a pin BUSIN for receiving a feedback signal PFB2 representing the output voltage (i.e., the intermediate DC voltage Vbus) of the pre-stage power supply conversion circuit. For example, as shown in FIG. 4, a feedback network composed of R4 and R5 is connected to the output end of a pre-stage power conversion circuit (e.g., shown as a PFC circuit), and generates a feedback signal PFB2 based on the intermediate DC voltage Vbus output by the pre-stage power conversion circuit. In an embodiment, the feedback signal PFB2 is transmitted to the logic control core unit 422 through the pin BUSIN, and the logic control core unit 422 generates a pre-stage disabling signal PDIS for disabling the pre-stage power management chip 410 based on the received feedback signal PFB2. In an implementation, in the case of light load, when the feedback signal PFB2 is higher than a fourth preset voltage threshold, the switching circuit 423 turns on the switching element in the analog signal generating/receiving circuit 424 based on the pre-stage circuit disable signal PDIS, so that the multiplexed pin MUL is connected to the reference ground. Since the multiplexed pin MUL is connected to the pin COMP of the pre-stage power management chip 410, the voltage on the pin COMP of the pre-stage power management chip 410 can be pulled down to a reference ground voltage (e.g., 0V), and the driving signal generation circuit 412 stop outputting the driving signal GQ1 based on the voltage on the pin COMP being zero, so that the pre-stage power management chip 410 is disabled. For example, when the feedback signal PFB2 becomes lower than the fourth preset voltage threshold, the switching circuit 423 turns off the switching element in the analog signal generating/receiving circuit 424 and disconnect the multiplexed pin MUL from the reference ground. At this time, the voltage on the pin COMP is the same as the compensation signal PCOMP, and the pre-stage power management chip 410 turn to work.

Figure 5:
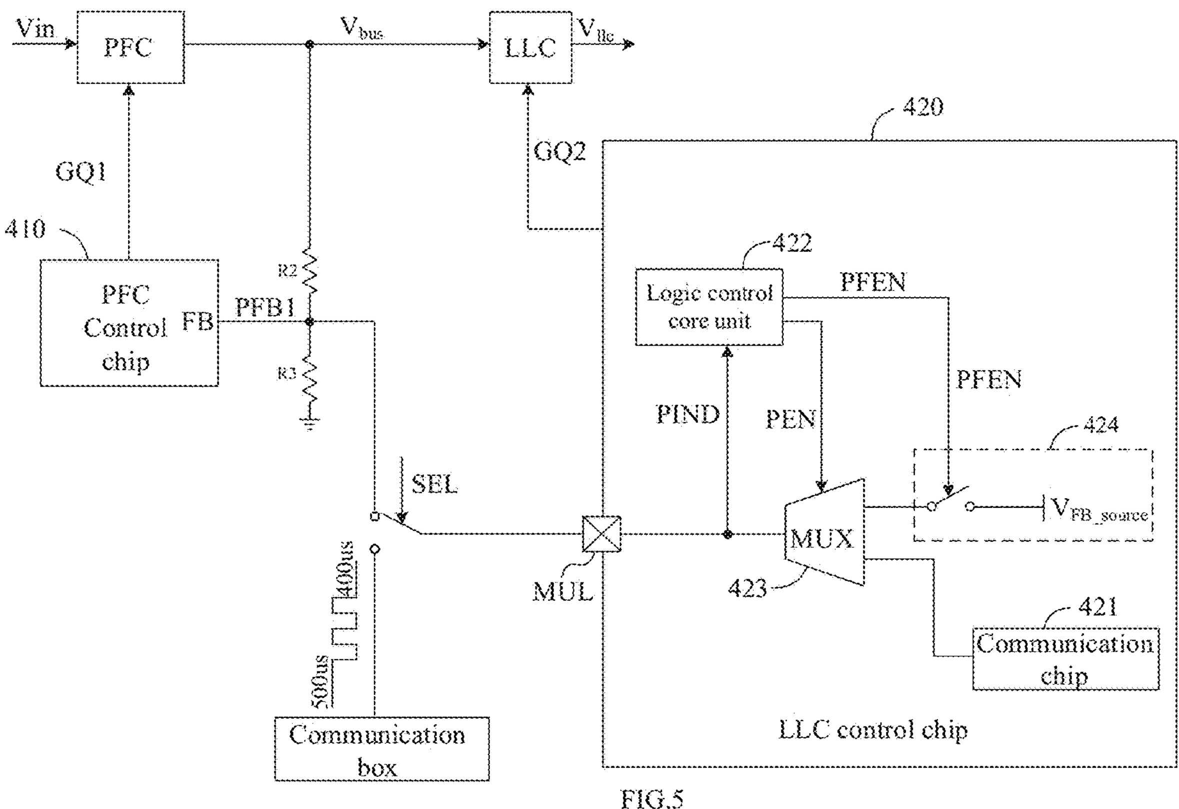
FIG. 5 shows a circuit diagram of power management chip system 500 with the multiplexed pin, according to an embodiment of the present disclosure.

FIG. 5 shows a circuit diagram of a power management chip system 500 with the multiplexed pin, according to an embodiment of the present disclosure. Compared with the power management chip system 400 shown in FIG. 4, the difference is that the post-stage power management chip 420 is connected to the feedback pin FB of the pre-stage power management chip 410 through the multiplexed pin MUL to receive the feedback signal PFB1 representing the output voltage of the pre-stage power conversion circuit (i.e., the intermediate DC voltage Vbus) from the pin FB, and the analog signal generating/receiving circuit 424 includes a switching element and a power supply VFB_source. For the sake of conciseness, the parts in FIG. 5 similar to those in FIG. 4 will not be described again.

In an embodiment, the multiplexed pin MUL of the post-stage power management chip 420 is coupled to the feedback terminal of the pre-stage power management chip 410 (e.g., shown as pin FB) for sensing the voltage on the feedback terminal of the pre-stage power management chip 410. For example, when it is necessary to transmit an analog signal by using the multiplexed pin MUL, the multiplexed pin MUL is coupled to the feedback end of the pre-stage power management chip 410 by using the selection signal SEL. As mentioned above, the amplitude of the voltage on the feedback terminal is lower than the second preset voltage threshold. In an embodiment, when the power management chip 420 is in the condition of light load, the power management chip 420 uses the logic control core unit 422 to generate the feedback enable signal PFEN to turn on the switching element in the analog signal generating/receiving circuit 424 and connect the multiplexed pin MUL to the power supply VFB_source. Since the multiplexed pin MUL is connected to the pin FB of the pre-stage power management chip 410, a current can be injected into the pin FB through the power supply VFB_source, thereby increasing the voltage on the pin FB. The driving signal generation circuit in the pre-stage power management chip 410 (such as the driving signal generation circuit 412 mentioned above) can adjust the driving signal GQ1 based on the increased voltage on the pin FB, thereby reducing the intermediate output voltage Vbus of the pre-stage power supply conversion circuit (e.g., shown as a PFC circuit). The reduction of the intermediate output voltage Vbus can reduce the working frequency of the post-stage power conversion circuit (e.g., the LLC circuit shown in the figure), reduce the switching loss and improve the efficiency.

By adopting the power management chip and the power management chip system in the present disclosure, only one pin is needed to receive communication indication signals, transmit analog signals and transmit digital signals. In addition, the starting signal of the external communication box can be directly used as the communication indication signal without setting a special circuit (e.g., a pull-up circuit) to generate the indication signal.

Those skilled in the art should know that any logic control core unit that can realize the above control function is applicable to the present disclosure.

Although some embodiments of the present disclosure have been described in detail above, it should be understood that these embodiments are only for illustrative purposes and are not used to limit the scope of the present disclosure. Other feasible alternative embodiments can be known to those of ordinary skill in the art by reading the present disclosure.

The invention claimed is:

1. A power management chip comprising:

a multiplexed pin, configured to receive a communication indication signal, transmit an analog signal and transmit a digital signal;

a communication circuit coupled to the multiplexed pin, and configured to execute digital communication through the multiplexed pin;

a logic control core unit coupled to the multiplexed pin, configured to receive the communication indication signal from the multiplexed pin and configured to enable the multiplexed pin to transmit the digital signal based on the communication indication signal.

2. The power management chip according to claim 1, wherein a voltage amplitude of the analog signal is lower than a first voltage threshold.

3. The power management chip according to claim 2, wherein the communication indication signal has a voltage amplitude exceeding the first voltage threshold during a preset duration.

4. The power management chip according to claim 1, wherein the multiplexed pin is configured to couple to an external communication box to receive the communication indication signal from the communication box, and wherein when the multiplexed pin is configured to transmit the digital signal, it is configured to receive the digital signal from or transmit the digital signal to the communication box.

5. The power management chip according to claim 4, wherein the multiplexed pin is configured to receive a startup signal of the communication box from the communication box as the communication indication signal.

6. The power management chip according to claim 1, wherein the logic control core unit connects the multiplexed pin to the communication circuit based on the communication indication signal, the multiplexed pin is configured to transmit the digital signal.

7. The power management chip according to claim 1, wherein the multiplexed pin is further configured to receive a communication stop signal, and wherein the logic control core unit configures the multiplexed pin to transmit the analog signal based on the communication stop signal received from the multiplexed pin.

8. The power management chip according to claim 7, wherein the logic control core unit disconnects the connection between the multiplexed pin and the communication circuit based on the communication stop signal.

9. The power management chip according to claim 1, wherein the multiplexed pin is configured to be connected to a pre-stage power management chip to receive the analog signal from or send the analog signal to the pre-stage power management chip.

10. The power management chip according to claim 9, wherein the multiplexed pin is configured to be connected to one of a feedback terminal and a compensation terminal of the pre-stage power management chip.

11. The power management chip according to claim 9, wherein the power management chip is a resonant conversion control chip, and the pre-stage power management chip is a power factor correction control chip.

12. A power management chip system comprising a pre-stage power management chip and a post-stage power management chip, wherein the post-stage power management chip is connected to the pre-stage power management chip through a multiplexed pin, and the post-stage power management chip comprises:

the multiplexed pin is configured to receive a communication indication signal, transmit an analog signal and transmit a digital signal;

the communication circuit is configured to execute digital communication through the multiplexed pin; and a logic control core unit, coupled to the multiplexed pin, configured to receive the communication indication signal from the multiplexed pin and configured to enable the multiplexed pin to transmit the digital signal based on the communication indication signal.

13. The power management chip system according to claim 12, wherein a voltage amplitude of the analog signal is lower than a first voltage threshold.

14. The power management chip system according to claim 13, wherein the communication indication signal has a voltage amplitude exceeding the first voltage threshold during a preset duration.

15. The power management chip system according to claim 12, wherein the multiplexed pin is configured to coupled to an external communication box to receive the communication indication signal from the communication box, and wherein when the multiplexed pin is configured to transmit the digital signal, it is configured to receive the digital signal from or transmit the digital signal to the communication box.

16. The power management chip system according to claim 15, wherein the multiplexed pin is configured to receive a startup signal of the communication box from the communication box as the communication indication signal.

17. The power management chip system according to claim 12, wherein the logic control core unit connects the multiplexed pin to a communication circuit based on the communication indication signal to configure the multiplexed pin to transmit the digital signal.

18. The power management chip system according to claim 12, wherein the multiplexed pin is configured to receive a communication stop signal, and wherein the logic control core unit configures the multiplexed pin to transmit the analog signal based on the communication stop signal received from the multiplexed pin.

19. The power management chip system according to claim 18, wherein the logic control core unit disconnects the connection between the multiplexed pin and the communication circuit based on the communication stop signal.

20. The power management chip system according to claim 12, wherein the multiplexed pin is configured to be connected to a pre-stage power management chip to receive the analog signal from or send the analog signal to the pre-stage power management chip.

21. The power management chip system according to claim 20, wherein the multiplexed pin is connected to one of a feedback terminal and a compensation terminal of the pre-stage power management chip.

22. The power management chip system according to claim 20, wherein the post-stage power management chip is a resonant conversion control chip and the pre-stage power management chip is a power factor correction control chip.

* * * * *